US011386836B1

(12) United States Patent
Cheng et al.

(10) Patent No.: US 11,386,836 B1
(45) Date of Patent: Jul. 12, 2022

(54) AMPLIFIER FOR DRIVING DISPLAY PANEL AND RELATED CONTROL METHOD

(71) Applicant: NOVATEK Microelectronics Corp., Hsin-Chu (TW)

(72) Inventors: Jhih-Siou Cheng, New Taipei (TW); Ju-Lin Huang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 17/372,545

(22) Filed: Jul. 12, 2021

(51) Int. Cl.
*G09G 3/32* (2016.01)
*H03F 3/16* (2006.01)

(52) U.S. Cl.
CPC .............. *G09G 3/32* (2013.01); *H03F 3/16* (2013.01); *G09G 2300/08* (2013.01); *G09G 2310/0275* (2013.01); *G09G 2310/0291* (2013.01); *G09G 2320/02* (2013.01); *G09G 2330/021* (2013.01)

(58) Field of Classification Search
CPC ................. G09G 3/32; G09G 2300/08; G09G 2310/0275; G09G 2310/0291; G09G 2320/02; G09G 2330/021; H03F 3/16
See application file for complete search history.

(56) References Cited

U.S. PATENT DOCUMENTS 10,497,308 B1 * 12/2019 Tseng .................... G09G 3/3233
2020/0111424 A1 * 4/2020 Oh ......................... G09G 3/3233

* cited by examiner

*Primary Examiner* — Andrew Sasinowski
(74) *Attorney, Agent, or Firm* — Winston Hsu (57) ABSTRACT

An amplifier for driving a display panel includes an input stage, a gain stage and an output stage. The gain stage is coupled to the input stage. The output stage, coupled to the gain stage, includes a first output driving circuit and a second output driving circuit. The first output driving circuit is operated in a first voltage domain. The second output driving circuit is operated in a second voltage domain different from the first voltage domain.

8 Claims, 12 Drawing Sheets

|  | SWA | SWB | SWC | SWD | 1st MSB | 2nd MSB | 3rd MSB | Display data ... | LSB |
|---|---|---|---|---|---|---|---|---|---|
| High-voltage mode | ON | ON | OFF | OFF | 1 | 1 | 1 | X | X |
| | | | | | 1 | 1 | 0 | X | X |
| | | | | | 1 | 0 | 1 | X | X |
| Mid-voltage mode | ON | OFF | OFF | ON | 1 | 0 | 0 | X | X |
| | | | | | 0 | 1 | 1 | X | X |
| Low-voltage mode | OFF | OFF | ON | ON | 0 | 1 | 0 | X | X |
| | | | | | 0 | 0 | 1 | X | X |
| | | | | | 0 | 0 | 0 | X | X |

AMPLIFIER FOR DRIVING DISPLAY PANEL AND RELATED CONTROL METHOD

BACKGROUND OF THE INVENTION

1. Field of the Invention

The present invention relates to an amplifier for driving a display panel and a related control method, and more particularly, to an amplifier for driving a light-emitting diode (LED) panel and a related control method.

2. Description of the Prior Art

A source driver is a driver circuit used for controlling the operations of a display panel such as a liquid crystal display (LCD) panel, a light-emitting diode (LED) panel, or the like. The source driver may provide display data for the display panel through driving voltages, to control each pixel or subpixel of the display panel to show target brightness, so as to construct the entire image. The source driver may include multiple channels, each configured to provide display driving voltages for a column of subpixels in the display panel. An operational amplifier is usually disposed at the output terminal of each channel, for driving the corresponding data line on the panel to reach its target voltage.

In such a situation, a source driver may have a great number of operational amplifiers for driving multiple data lines on the panel, where each operational amplifier has a DC current consumption to be operated normally. The great number of operational amplifiers result in non-ignorable current consumption in the source driver. Thus, how to reduce current consumption of the source driver has become an important issue to be dealt with in this art.

SUMMARY OF THE INVENTION

It is therefore an objective of the present invention to provide an amplifier for driving a light-emitting diode (LED) panel and a related control method, where the amplifier has a novel output stage structure which is capable of reducing current consumption.

An embodiment of the present invention discloses an amplifier for driving a display panel. The amplifier comprises an input stage, a gain stage and an output stage. The gain stage is coupled to the input stage. The output stage, coupled to the gain stage, comprises a first output driving circuit and a second output driving circuit. The first output driving circuit is operated in a first voltage domain. The second output driving circuit is operated in a second voltage domain different from the first voltage domain.

Another embodiment of the present invention discloses a method for controlling an amplifier for driving a display panel. The amplifier has an output stage configured to be operated in one of a plurality of operation modes. The method comprises steps of: detecting a display data to be output to the display panel; and setting the output stage to be in one of the plurality of operation modes according to the display data.

These and other objectives of the present invention will no doubt become obvious to those of ordinary skill in the art after reading the following detailed description of the preferred embodiment that is illustrated in the various figures and drawings.

DETAILED DESCRIPTION

The driving operation for a liquid crystal display (LCD) panel is usually performed with a polarity inversion scheme, such as a dot inversion, column inversion, row inversion or frame inversion, so as to prevent permanent polarization of the liquid crystal molecules. Based on the polarity inversion, each subpixel may be driven through a driving voltage having positive polarity and a driving voltage having negative polarity alternately, where the positive polarity means that the driving voltage is greater than the common voltage, and the negative polarity means that the driving voltage is smaller than the common voltage. Accordingly, each operational amplifier for driving the LCD panel may be configured to output a positive polarity voltage or a negative polarity voltage in each display cycle (e.g., a horizontal line period). In general, in each display cycle, the operational amplifiers corresponding to a half of the channels in the source driver are configured to output a positive polarity voltage, and the operational amplifiers corresponding to another half of the channels in the source driver are configured to output a negative polarity voltage.

Figure 1A:
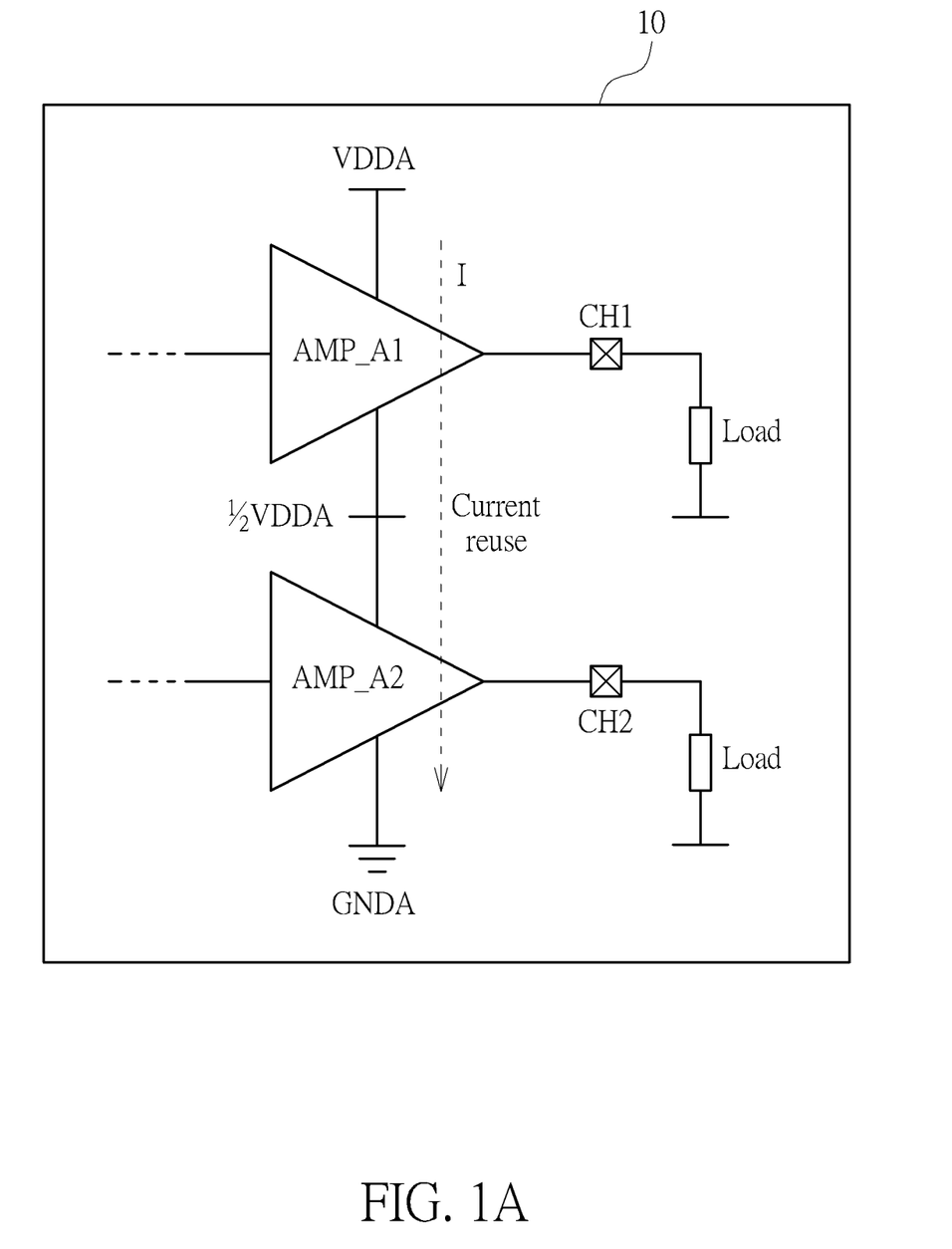
FIGS. 1A and 1B are schematic diagrams of a source driver using the half-voltage driving method for driving an LCD panel.
Figure 1B:
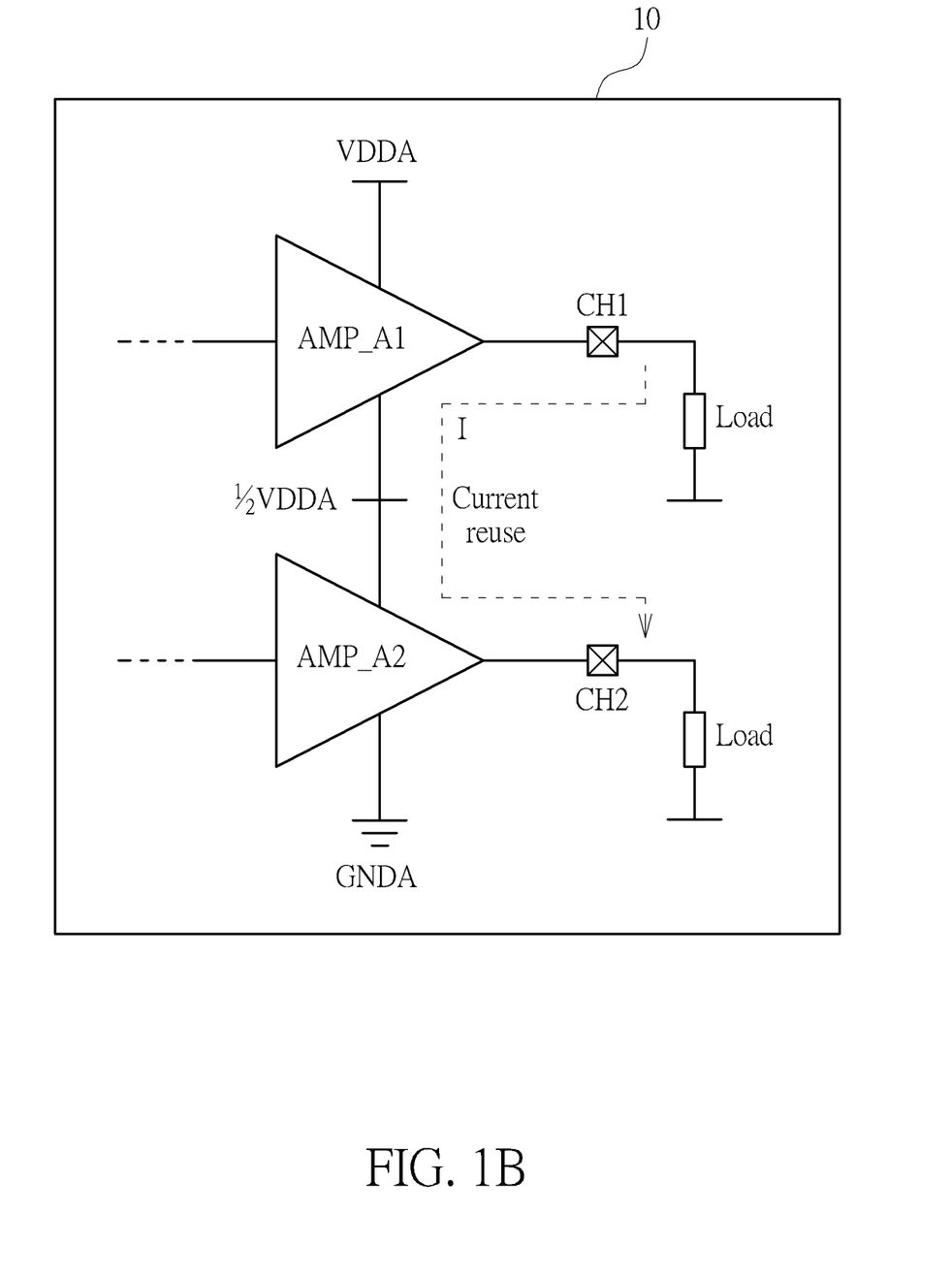

Therefore, based on the driving operation with polarity inversion, a half-voltage driving method may be applied, to reduce current consumption of the source driver. Please refer to FIGS. 1A and 1B, which are schematic diagrams of a source driver 10 using the half-voltage driving method for driving an LCD panel. As shown in FIGS. 1A and 1B, the source driver 10 includes two operational amplifiers AMP_A1 and AMP_A2 located in two channels CH1 and CH2, respectively. The operational amplifier AMP_A1 is configured to output a positive polarity voltage and the operational amplifier AMP_A2 is configured to output a negative polarity voltage. Note that there may be hundreds or thousands of operational amplifiers included in the source driver 10, and only two of the operational amplifiers are illustrated in FIGS. 1A and 1B for brevity. In addition, other circuit elements of the source driver 10 such as the shift registers, data latches and level shifters are omitted in FIGS. 1A and 1B without influencing the illustrations of the present example.

In this example, the output circuit of the source driver 10 is operated by receiving a power supply voltage VDDA and a ground voltage GNDA. Due to the polarity inversion, a half of the power supply voltage VDDA is enough to control the operational amplifiers AMP_A1 and AMP_A2 based on the voltage level to be output. In detail, the operational amplifier AMP_A1 may be operated between the power supply voltage VDDA and a half voltage VDDA/2 since it is configured to output the positive polarity voltage, and the operational amplifier AMP_A2 may be operated between the half voltage VDDA/2 and the ground voltage GNDA since it is configured to output the negative polarity voltage. Therefore, the operational amplifiers AMP_A1 and AMP_A2 may share the same voltage source of the half voltage VDDA/2. In such a situation, the DC current of the operational amplifier AMP_A1 may be reused by the operational amplifier AMP_A2, as shown in FIG. 1A. Further, the driving current received from the load (such as a data line of the LCD panel) through the channel CH1 and the operational amplifier AMP_A1 may also be reused by the operational amplifier AMP_A2 to be supplied through another channel CH2, as shown in FIG. 1B. As a result, both the DC current and the driving current of the source driver 10 may be reduced.

However, as for a light emitting diode (LED) panel, there is no polarity inversion mechanism, and thus the conventional operational amplifier of the source driver for driving the LED panel may be operated under full power supply voltage (e.g., VDDA). In such a situation, the DC current and driving current of an operational amplifier cannot be reused by another operational amplifier, such that the current consumption of all the operational amplifiers for the LED panel may be twice the current consumption of all the operational amplifiers for the LCD panel.

Figure 2A:
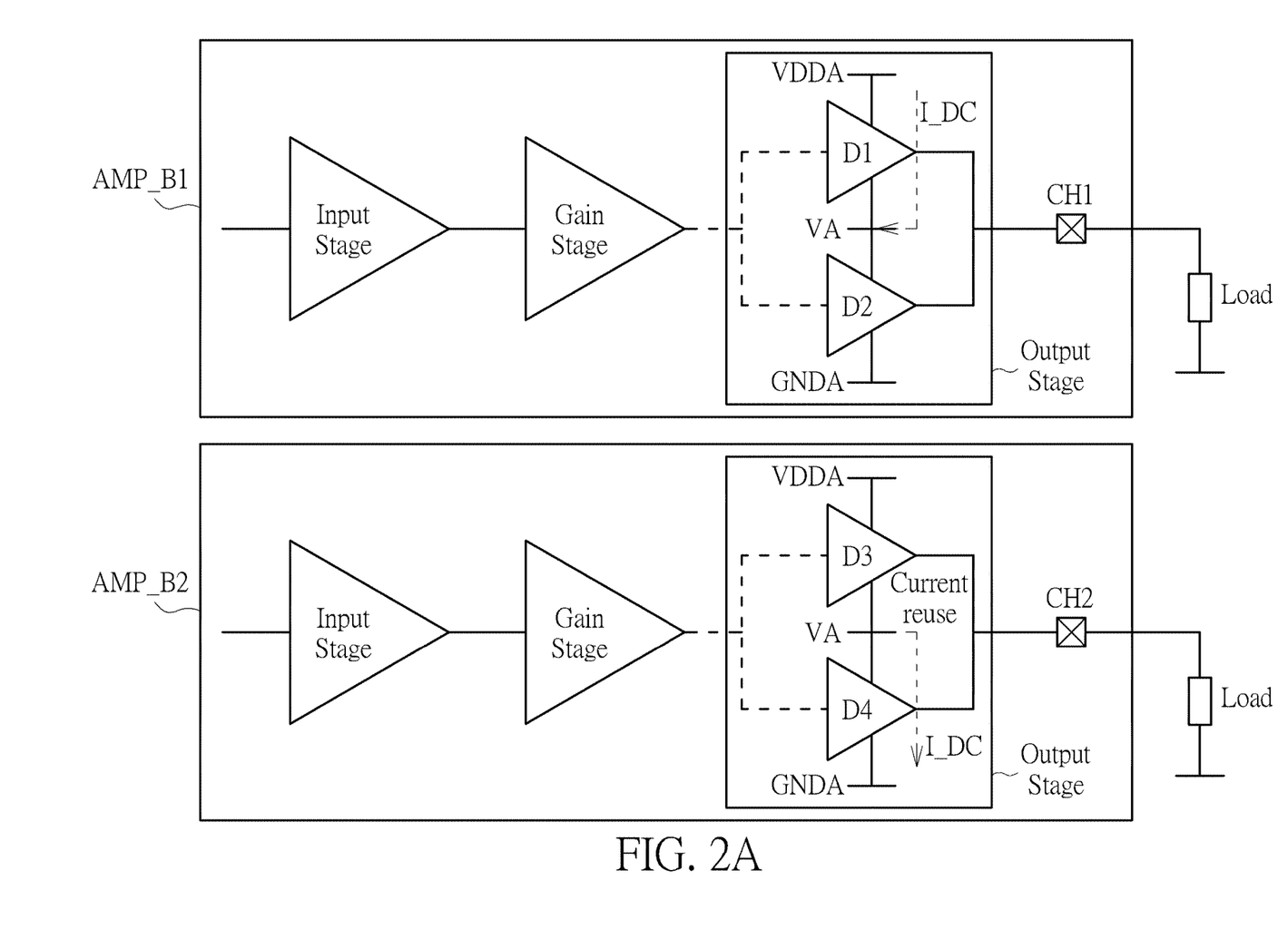
FIGS. 2A and 2B are schematic diagrams of operational amplifiers used in a source driver according to an embodiment of the present invention.
Figure 2B:
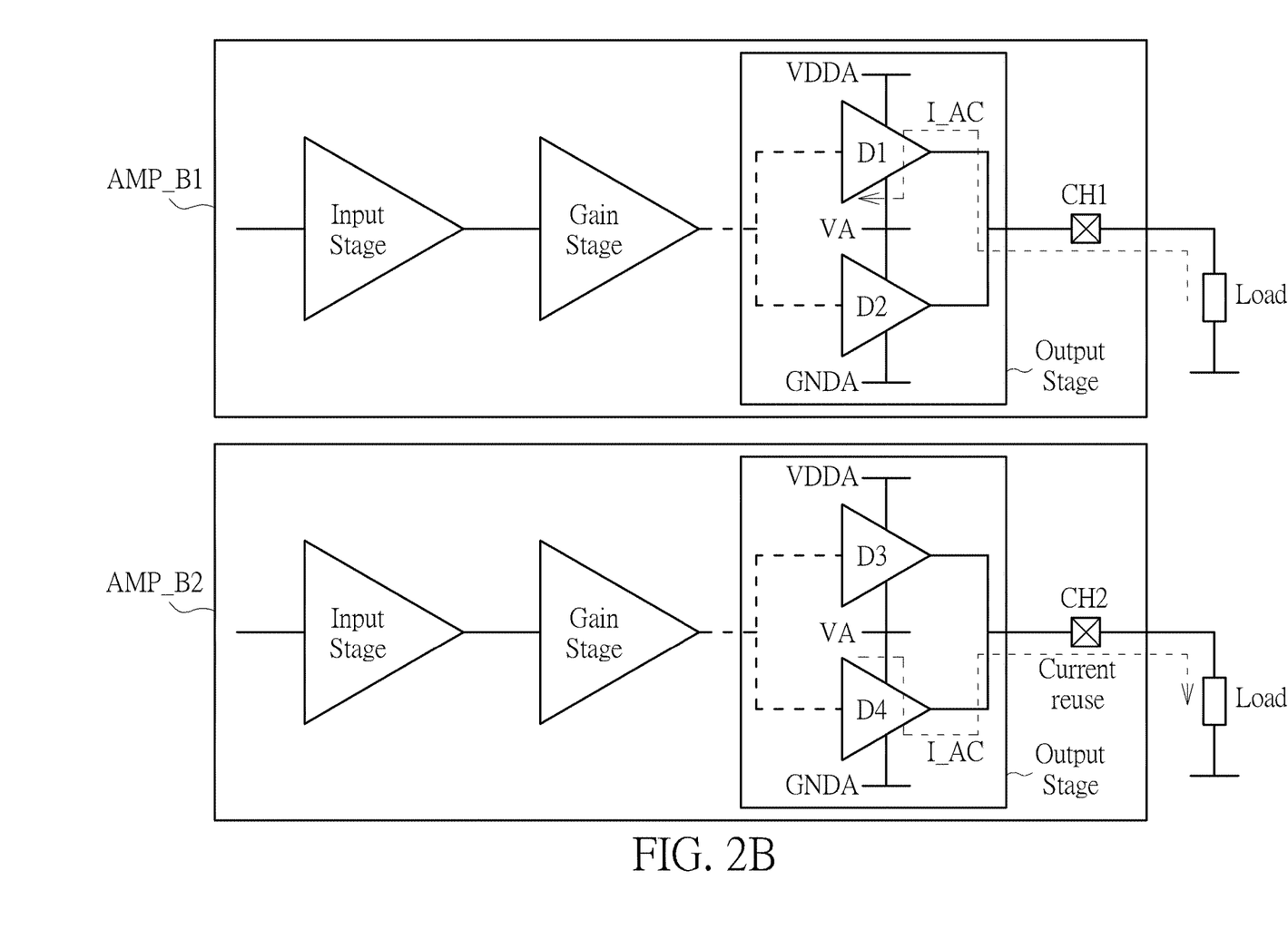

Please refer to FIGS. 2A and 2B, which are schematic diagrams of operational amplifiers used in a source driver according to an embodiment of the present invention. Although only two operational amplifiers AMP_B1 and AMP_B2 are shown in FIGS. 2A and 2B, a person of ordinary skill in the art should understand that there may be hundreds or thousands of channels in the source driver and each channel is deployed with an operational amplifier. The operational amplifiers of the source driver may be used for driving an LED panel, such as an organic LED (OLED) panel, a mini-LED panel, a micro-LED panel, or the like.

As shown in FIGS. 2A and 2B, each operational amplifier AMP_B1 and AMP_B2 may include an input stage, a gain stage, and an output stage. In an embodiment, the input stage may be integrated with the gain stage. Alternatively or additionally, the gain stage may be integrated with the output stage. The operational amplifiers AMP_B1 and AMP_B2 are located in two channels CH1 and CH2, respectively. The operational amplifiers AMP_B1 and AMP_B2 may be any type of amplifiers having driving capability, which should not be served as a limitation of the scope of the present invention.

In detail, the output stage of the operational amplifier AMP_B1 includes output driving circuits D1 and D2, and the output stage of the operational amplifier AMP_B2 includes output driving circuits D3 and D4. In the operational amplifier AMP_B1, the output driving circuit D1 is operated in a higher voltage domain by receiving a power supply voltage VDDA and a medium voltage VA, and the output driving circuit D2 is operated in a lower voltage domain by receiving another power supply voltage (e.g., the ground voltage GNDA) and the medium voltage VA. The medium voltage VA may be in any voltage level between the power supply voltage VDDA and the ground voltage GNDA. Preferably, the medium voltage VA may be equal to or close to a half of the power supply voltage VDDA (i.e., VDDA/2). Similarly, in the operational amplifier AMP_B2, the output driving circuit D3 is operated in a higher voltage domain by receiving the power supply voltage VDDA and the medium voltage VA, and the output driving circuit D4 is operated in a lower voltage domain by receiving another power supply voltage (e.g., the ground voltage GNDA) and the medium voltage VA. Both the operational amplifiers AMP_B1 and AMP_B2 receive the medium voltage VA for operations, and may share the same voltage source capable of supplying this medium voltage VA.

Based on the structure of the output stage, the current reuse may be feasible between the operational amplifiers AMP_B1 and AMP_B2. For example, the channel CH1 may be configured to output a driving voltage higher than the medium voltage VA, while the channel CH2 may be configured to output a driving voltage lower than the medium voltage VA. In such a situation, the output stage of the operational amplifier AMP_B1 may be operated in a high-voltage mode, so that the output driving circuit D1 is enabled and the output driving circuit D2 is disabled. Meanwhile, the output stage of the operational amplifier AMP_B2 may be operated in a low-voltage mode, so that the output driving circuit D4 is enabled and the output driving circuit D3 is disabled.

Therefore, the DC current I_DC of the operational amplifier AMP_B1 may be reused by the operational amplifier AMP_B2. As shown in FIG. 2A, the DC current I_DC used by the operational amplifier AMP_B1 is sourced from the power supply terminal of VDDA and sunk to a common node of the medium voltage VA. The same DC current I_DC may further be reused by the operational amplifier AMP_B2, as being sourced from the common node of the medium voltage VA and sunk to the ground terminal. In such a situation, the operational amplifiers AMP_B1 and AMP_B2 may share the same current and use common electric charges.

In addition, the driving current I_AC of the operational amplifier AMP_B1 may also be reused by the operational amplifier AMP_B2. As shown in FIG. 2B, the driving current I_AC may be received from the load (such as a data line of the LED panel) through the channel CH1 and the operational amplifier AMP_B1, and the driving current I_AC may be reused by the operational amplifier AMP_B2 to be supplied through the channel CH2.

As a result, partial or all current consumption of the operational amplifier AMP_B2 may be received from the sinking current of another operational amplifier AMP_B1, and thus the current output from the original power source may be reduced. Therefore, the overall current and power consumption of all operational amplifiers in the source driver may be reduced.

In another embodiment, the channel CH1 may be configured to output a driving voltage lower than the medium voltage VA, while the channel CH2 may be configured to output a driving voltage higher than the medium voltage VA. In such a situation, the output stage of the operational amplifier AMP_B1 may be operated in a low-voltage mode, so that the output driving circuit D2 is enabled and the output driving circuit D1 is disabled. Meanwhile, the output stage of the operational amplifier AMP_B2 may be operated in a high-voltage mode, so that the output driving circuit D3 is enabled and the output driving circuit D4 is disabled. In this embodiment, the DC current I_DC from the operational amplifier AMP_B2 may flow to the operational amplifier AMP_B1, and the driving current I_AC of the operational amplifier AMP_B2 may be reused by the operational amplifier AMP_B1.

In a further embodiment, the driving voltages output through the channels CH1 and CH2 may be both higher than the medium voltage VA at the same time, or both lower than the medium voltage VA at the same time. In such a situation, the output stage of both the operational amplifiers AMP_B1 and AMP_B2 may be operated in the same voltage mode, and thus the current reuse may not be realized between the operational amplifiers AMP_B1 and AMP_B2. However, there may be a great number of operational amplifiers in the source driver for driving the panel. Suppose that most or all of the operational amplifiers in the source driver apply the circuit structure having multiple output driving circuits operated in different voltage domains in the output stage. As long as at least one of these operational amplifiers is operated in the low-voltage mode to output a driving voltage lower than the medium voltage VA while other operational amplifiers are operated in the high-voltage mode to output a driving voltage higher than the medium voltage VA, or at least one of these operational amplifiers is operated in the high-voltage mode to output a driving voltage higher than the medium voltage VA while other operational amplifiers are operated in the low-voltage mode to output a driving voltage lower than the medium voltage VA, the current reuse may be feasible. More specifically, the currents of those operational amplifiers and output circuits operated in the high-voltage mode may be reused by those operated in the low-voltage mode, and the sinking current from those operational amplifiers and channels having a higher voltage level may be supplied as the sourcing current for those operational amplifiers and channels having a lower voltage level. As a result, the circuit structure of the operational amplifiers and the related operations provided in this disclosure may realize the reduction of current consumption for most image frames to be shown on the display panel.

Figure 3:
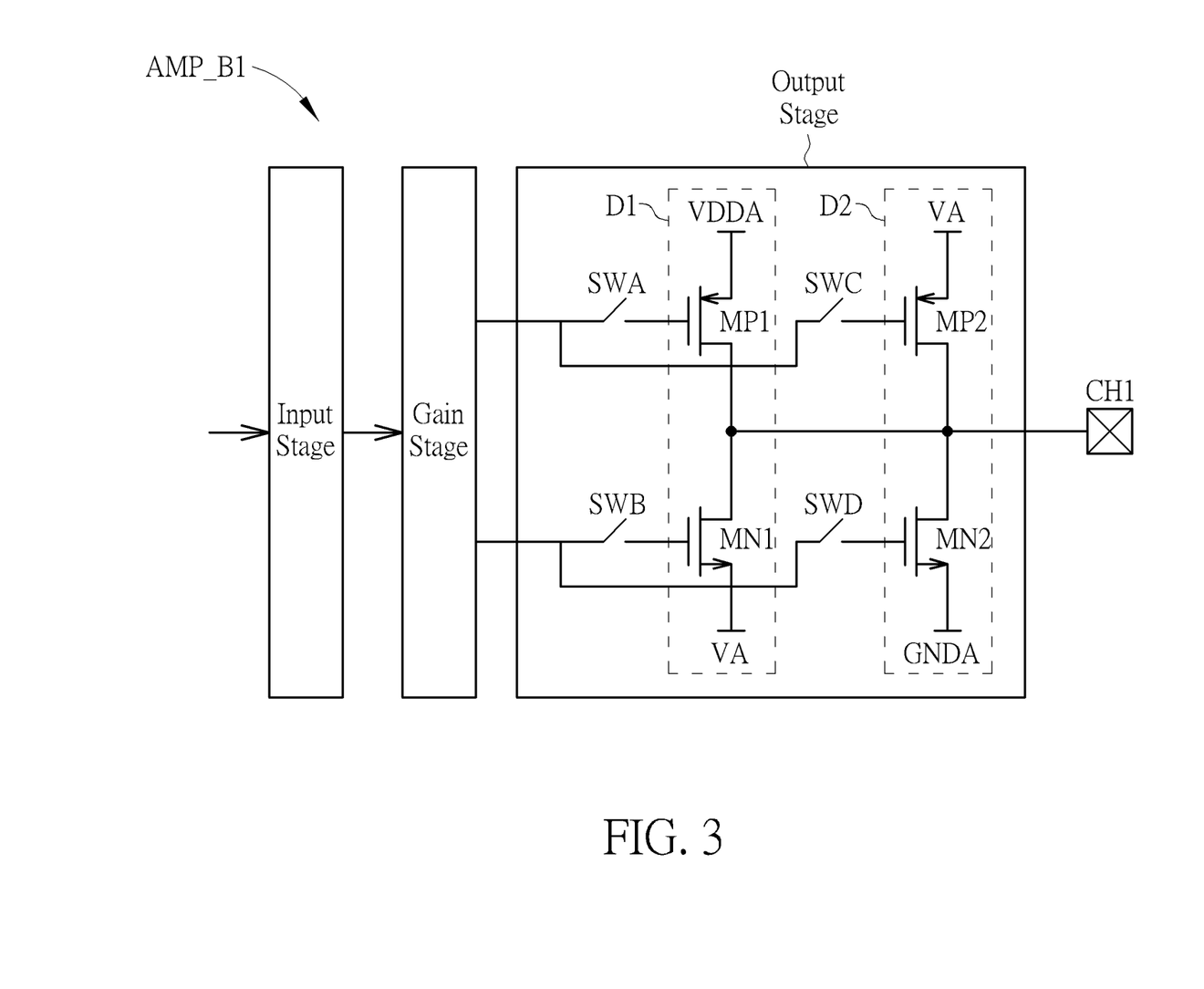
FIG. 3 illustrates an exemplary implementation of the operational amplifier.

FIG. 3 illustrates an exemplary implementation of the operational amplifier AMP_B1 or AMP_B2. As shown in FIG. 3, the operational amplifier AMP_B1 having the output driving circuits D1 and D2 in the output stage is taken as an example. The output driving circuit D1 includes driving transistors MP1 and MN1, and the output driving circuit D2 includes driving transistors MP2 and MN2. In detail, the driving transistor MP1, which may be a PMOS transistor, is coupled between a high power supply terminal that supplies the power supply voltage VDDA and the output terminal of the operational amplifier AMP_B1. The driving transistor MN1, which may be an NMOS transistor, is coupled between a medium power supply terminal that supplies the medium voltage VA and the output terminal of the operational amplifier AMP_B1. The driving transistor MP2, which may be a PMOS transistor, is coupled between the medium power supply terminal that supplies the medium voltage VA and the output terminal of the operational amplifier AMP_B1. The driving transistor MN2, which may be an NMOS transistor, is coupled between a low power supply terminal that supplies the ground voltage GNDA and the output terminal of the operational amplifier AMP_B1.

In addition, the driving transistors MP1, MN1, MP2 and MN2 may be controlled by switches SWA, SWB, SWC and SWD, respectively, as shown in FIG. 3. In detail, the switch SWA is coupled between the gate terminal of the driving transistor MP1 and the gain stage of the operational amplifier AMP_B1. The switch SWB is coupled between the gate terminal of the driving transistor MN1 and the gain stage of the operational amplifier AMP_B1. The switch SWC is coupled between the gate terminal of the driving transistor MP2 and the gain stage of the operational amplifier AMP_B1. The switch SWD is coupled between the gate terminal of the driving transistor MN2 and the gain stage of the operational amplifier AMP_B1. Under the operations of the switches SWA, SWB, SWC and SWD, the output stage of the operational amplifier AMP_B1 may be well controlled to be operated in an appropriate mode.

Figure 4:
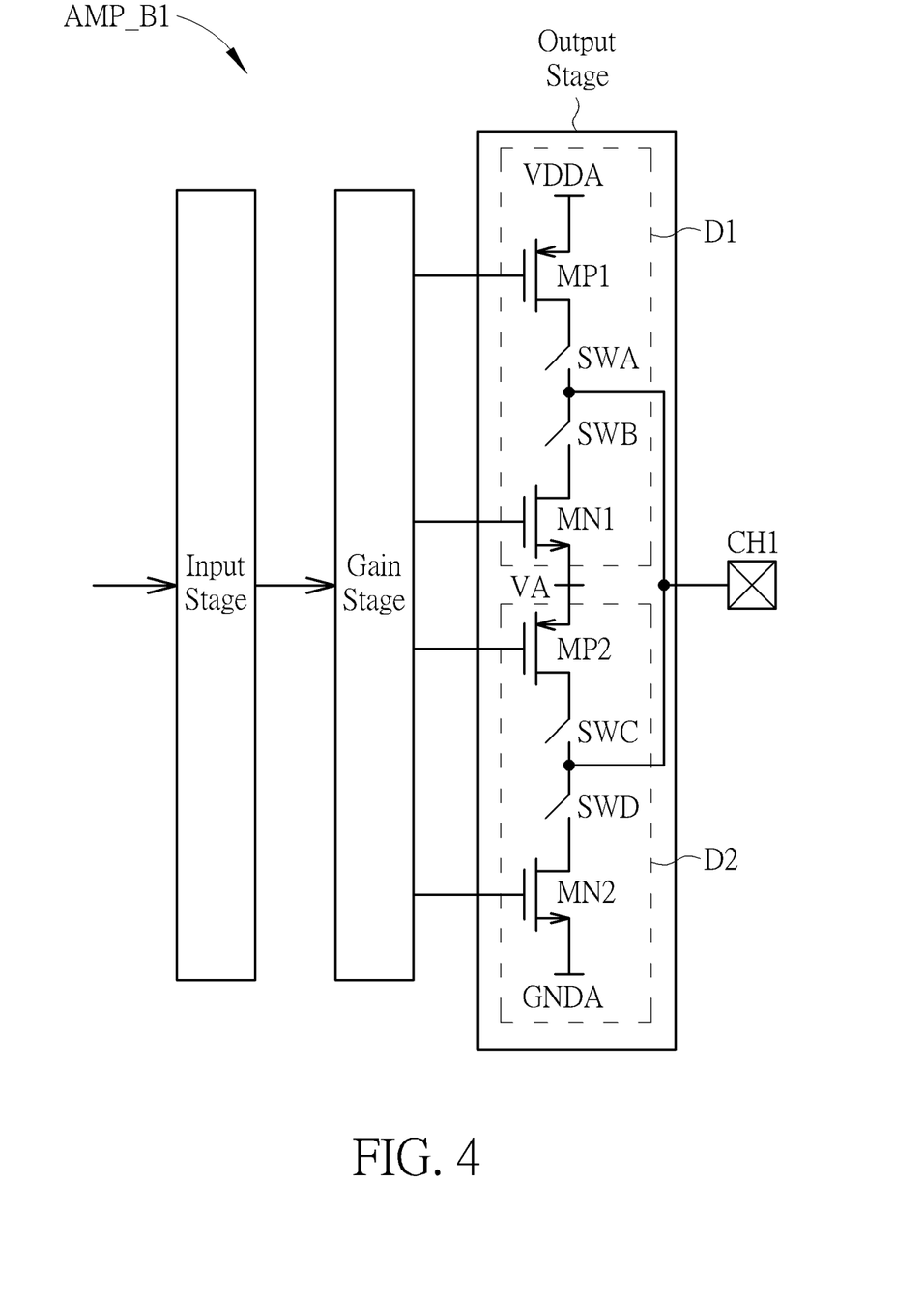
FIG. 4 illustrates another exemplary implementation of the operational amplifier.

Please note that the implementations of the switches SWA, SWB, SWC and SWD are not limited to the structure as shown in FIG. 3. Please refer to FIG. 4, which illustrates another exemplary implementation of the operational amplifier AMP_B1 or AMP_B2. Take the operational amplifier AMP_B1 having the output driving circuits D1 and D2 in the output stage as an example, as shown in FIG. 4. Each of the switches SWA, SWB, SWC and SWD is coupled between the corresponding driving transistor and the output terminal of the operational amplifier AMP_B1. In detail, the switch SWA is coupled between the drain terminal of the driving transistor MP1 and the output terminal of the operational amplifier AMP_B1. The switch SWB is coupled between the drain terminal of the driving transistor MN1 and the output terminal of the operational amplifier AMP_B1. The switch SWC is coupled between the drain terminal of the driving transistor MP2 and the output terminal of the operational amplifier AMP_B1. The switch SWD is coupled between the drain terminal of the driving transistor MN2 and the output terminal of the operational amplifier AMP_B1. As long as the switches SWA, SWB, SWC and SWD can be used to control the corresponding driving transistor to be enabled or disabled, these switches may be implemented in any appropriate manner.

Figure 5:
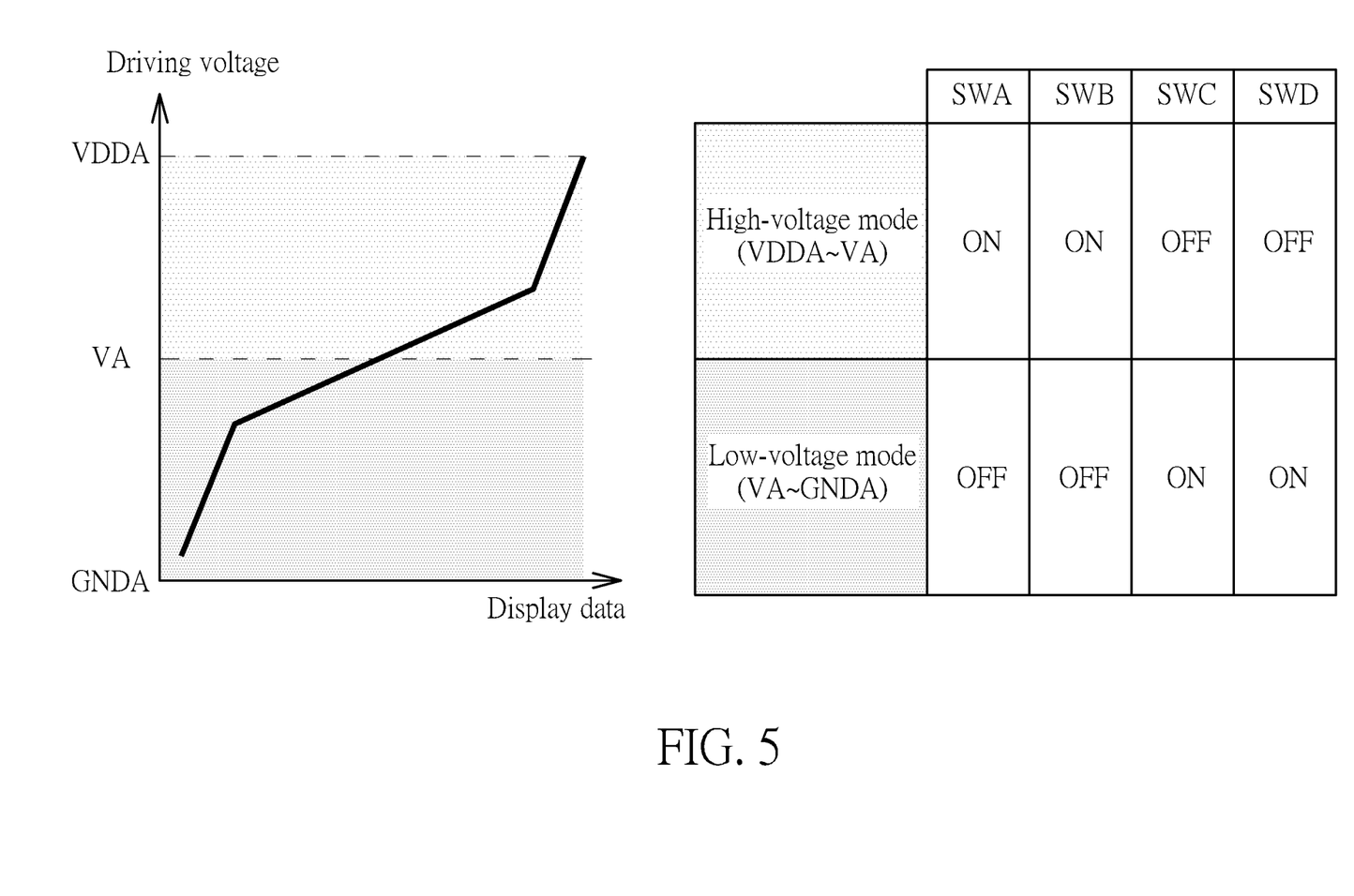
FIG. 5 illustrates an operation of the switches for controlling the operational amplifier.

FIG. 5 illustrates an operation of the switches SWA, SWB, SWC and SWD for controlling the operational amplifier AMP_B1. If the channel CH1 is configured to output a driving voltage between the power supply voltage VDDA and the medium voltage VA, the output stage of the operational amplifier AMP_B1 may be set to be in the high-voltage mode. At this moment, the switches SWA and SWB are turned on and the switches SWC and SWD are turned off; hence, the operational amplifier AMP_B1 may output the driving voltage using the driving transistors MP1 and MN1. If the channel CH1 is configured to output a driving voltage between the medium voltage VA and the ground voltage GNDA, the output stage of the operational amplifier AMP_B1 may be set to be in the low-voltage mode. At this moment, the switches SWC and SWD are turned on and the switches SWA and SWB are turned off; hence, the operational amplifier AMP_B1 may output the driving voltage using the driving transistors MP2 and MN2.

Please note that the operational amplifiers of the source driver may usually be implemented with a rail-to-rail output stage so as to output a wide range of driving voltages based on the display data. In general, the output impedance of this type of operational amplifier may fall when the output voltage of the operational amplifier is close to its maximum or minimum voltage, resulting in insufficient loop gain for the maximum or minimum output voltage. If the loop gain of the operational amplifier is insufficient, the image brightness driven by the operational amplifier may deviate from its correct value. In the LCD's source driver 10 as shown in FIGS. 1A and 1B, the maximum and minimum voltages of the operational amplifier 10 may correspond to the maximum and minimum brightness of the display data under the polarity inversion mechanism. Fortunately, a viewer of the panel may not easily be aware of a deviation of the maximum or minimum brightness in the image, so that the insufficient loop gain of the extremely high or low driving voltage may not degrade the image quality obviously.

However, as for the operational amplifier having multiple output driving circuits in the output stage as shown in FIGS. 2A and 2B, one of the maximum and minimum output voltages of the operational amplifier may be equal to the medium voltage VA, which corresponds to a medium display data and is used to drive the panel to show moderate brightness. For example, in the operational amplifier AMP_B1, if the output driving circuit D1 is used, the maximum output voltage may be close to or equal to the power supply voltage VDDA and the minimum output voltage may be close to or equal to the medium voltage VA; if the output driving circuit D2 is used, the maximum output voltage may be close to or equal to the medium voltage VA and the minimum output voltage may be close to or equal to the ground voltage GNDA.

In such a situation, the insufficient loop gain of the operational amplifier may result in a deviation on moderate brightness corresponding to a voltage level approximately equal to the medium voltage VA, and a viewer's eyes is usually sensitive to this brightness deviation. Therefore, the image degradation caused by the insufficient loop gain may be easily perceived by the viewer.

Figure 6:
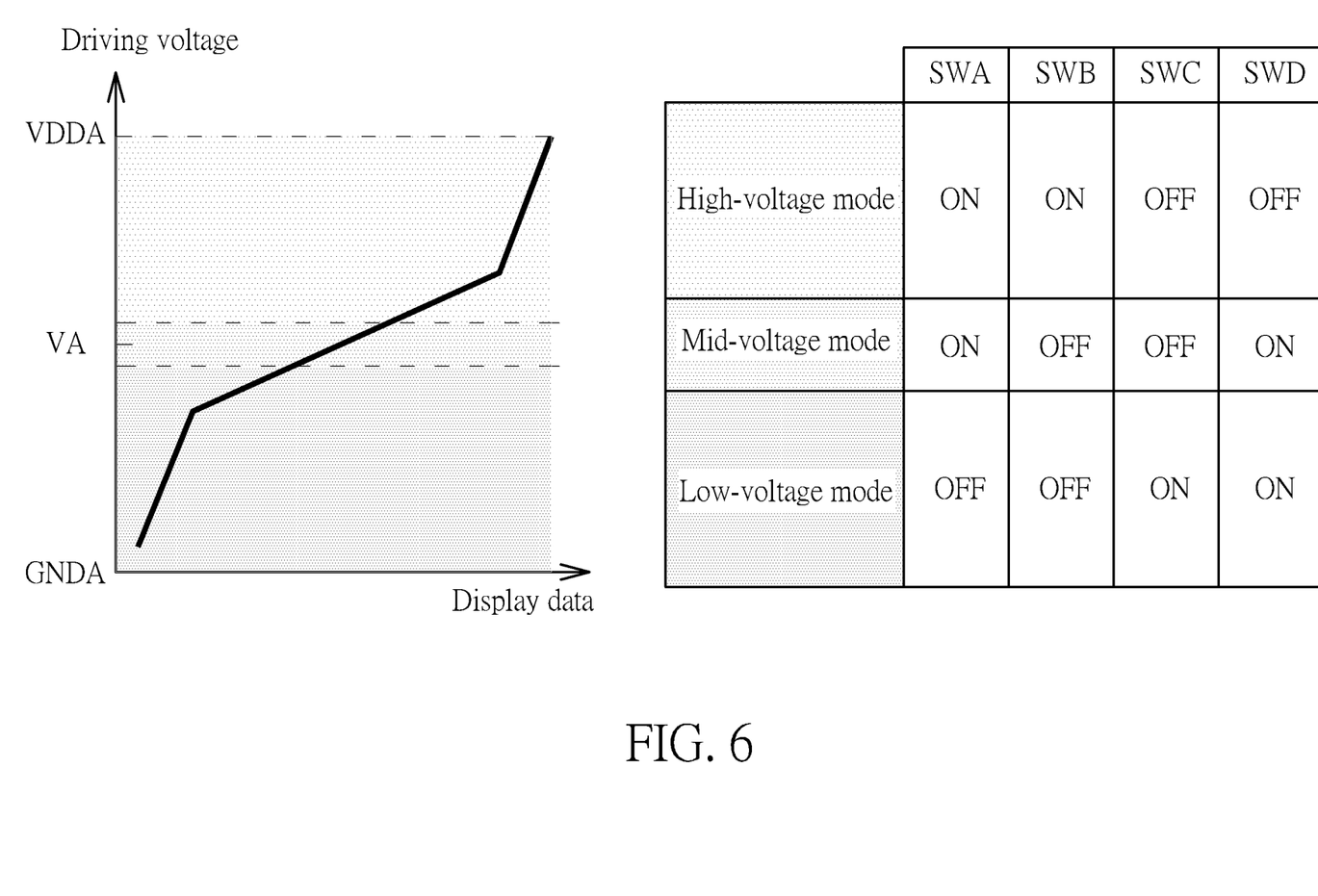
FIG. 6 illustrates an operation of the switches for controlling the operational amplifier when the mid-voltage mode is included.

In order to solve this problem, a mid-voltage mode may be applied in the operational amplifier if the driving voltage output by the operational amplifier is in the vicinity of the medium voltage VA. FIG. 6 illustrates an operation of the switches SWA, SWB, SWC and SWD for controlling the operational amplifier AMP_B1 when the mid-voltage mode is included. As shown in FIG. 6, when the display data or the driving voltage output by the operational amplifier AMP_B1 is higher than a first threshold, the output stage of the operational amplifier AMP_B1 may be set to be in the high-voltage mode, where the switches SWA and SWB are turned on and the switches SWC and SWD are turned off, and thus the driving transistors MP1 and MN1 are enabled. When the display data or the driving voltage output by the operational amplifier AMP_B1 is lower than a second threshold, the output stage of the operational amplifier AMP_B1 may be set to be in the low-voltage mode, where the switches SWC and SWD are turned on and the switches SWA and SWB are turned off, and thus the driving transistors MP2 and MN2 are enabled. When the display data or the driving voltage output by the operational amplifier AMP_B1 is between the first threshold and the second threshold, the output stage of the operational amplifier AMP_B1 may be set to be in the mid-voltage mode, where the switches SWA and SWD are turned on and the switches SWB and SWC are turned off, and thus the driving transistors MP1 and MN2 are enabled. As shown in FIG. 3 or 4, the enabled driving transistors MP1 and MN2 are operated by receiving the power supply voltage VDDA and the ground voltage GNDA; hence, the loop gain of the operational amplifier is still sufficiently high on the voltage level close to the medium voltage VA.

The first threshold and the second threshold for determining the usage range of the mid-voltage mode may be set in any appropriate manner. If the mid-voltage mode is used in a larger voltage range (which means that the threshold is slightly farther from the medium voltage VA), the problem of insufficient loop gain may be solved more completely, but higher current consumption of the operational amplifiers may be generated since the mid-voltage mode applies the full voltage domain between the power supply voltage VDDA and the ground voltage GNDA. If the mid-voltage mode is used in a smaller voltage range (which means that the threshold is closer to the medium voltage VA), more currents can be reused and saved, but possible image degradation might still appear when the high-voltage mode or low-voltage mode is applied.

Therefore, the operation mode of the output stage of the operational amplifier may be set based on the display data or the output voltage of the operational amplifier. In an embodiment, the operation mode may be determined by detecting the display data, which may be a grayscale code having multiple bits sent to the corresponding channel in the source driver. For example, each grayscale code may include N bits, and only several most significant bits (MSBs) are taken into consideration for determining the operation mode.

Figure 7:
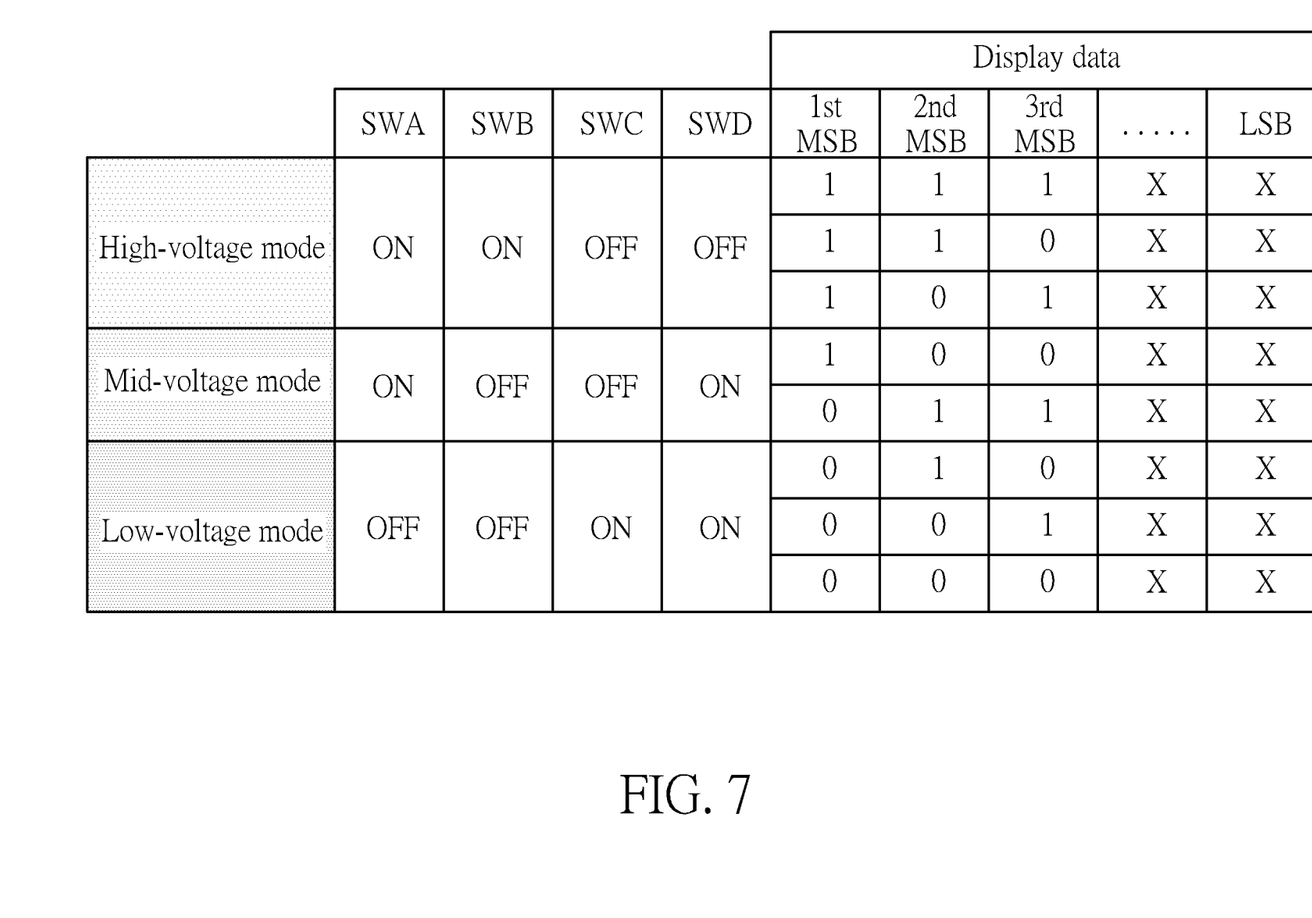
FIG. 7 illustrates a detailed implementation of determining the operation mode based on the detected display data according to an embodiment of the present invention.
Figure 8:
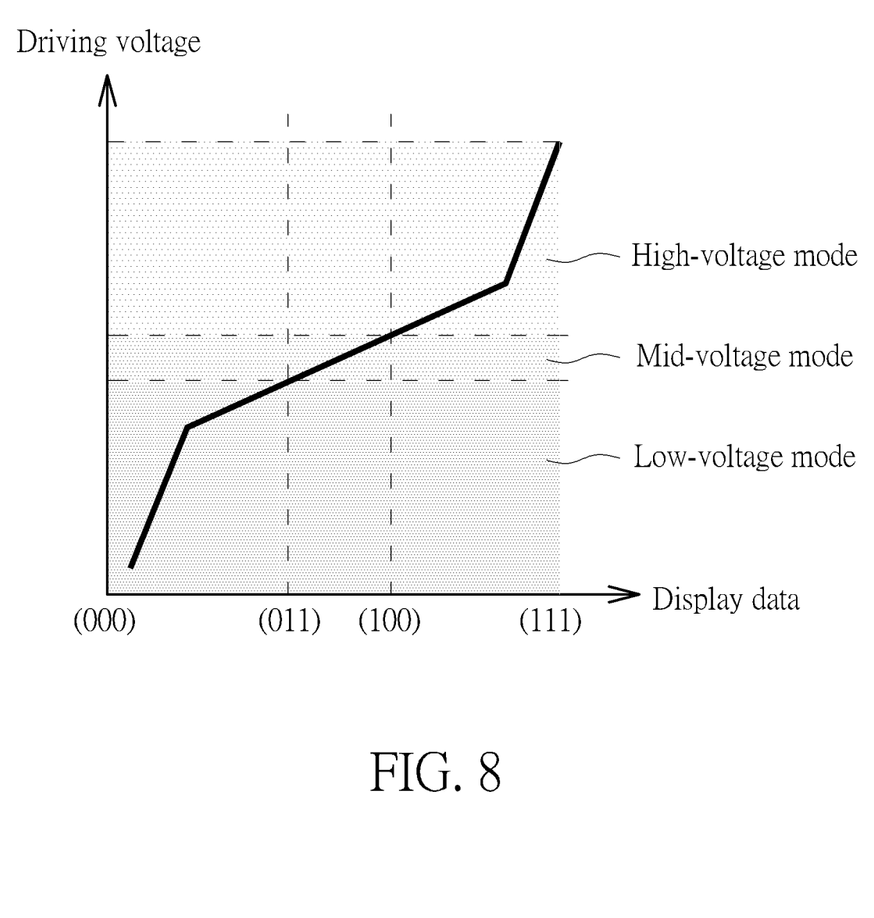
FIG. 8 is a schematic diagram of the operation modes under different display data and driving voltages.

FIG. 7 illustrates a detailed implementation of determining the operation mode based on the detected display data according to an embodiment of the present invention. As shown in FIG. 7, the display data is an N-bit grayscale code, where three MSBs, including the first MSB, the second MSB and the third MSB, may be applied to determine the operation mode of the operational amplifier and its output stage. In detail, if the three MSBs are "111", "110" or "101", the high-voltage mode may be applied, where the switches SWA and SWB are turned on and the switches SWC and SWD are turned off. If the three MSBs are "100" or "011", the mid-voltage mode may be applied, where the switches SWA and SWD are turned on and the switches SWB and SWC are turned off. If the three MSBs are "010", "001" and "000", the low-voltage mode may be applied, where the switches SWC and SWD are turned on and the switches SWA and SWB are turned off. The operation modes of the operational amplifier and the output stage under different display data and driving voltages are further illustrated in FIG. 8.

Figure 9:
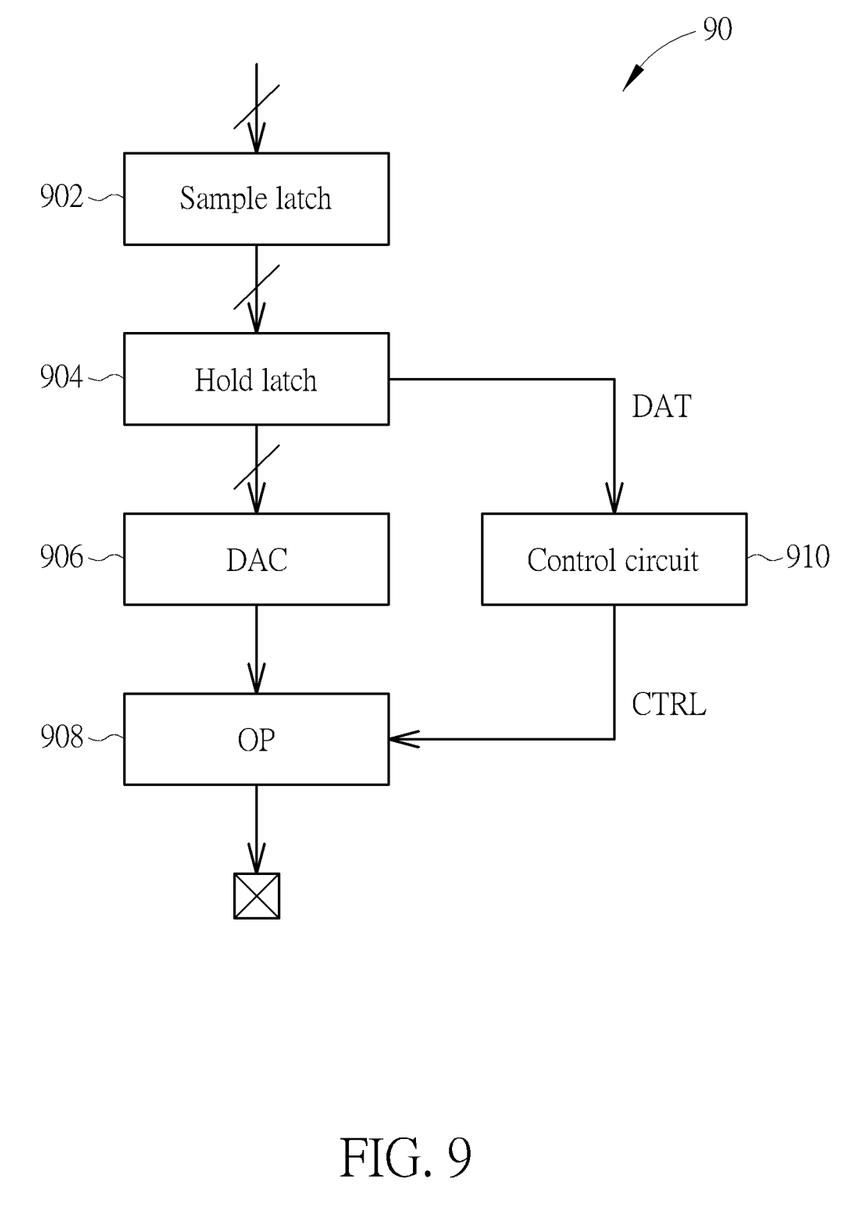
FIG. 9 is a schematic diagram of a source driver according to an embodiment of the present invention.

Please note that the display data may be detected in any manner. In an embodiment, the operational amplifier may receive information of the display data from the data latch corresponding to the operational amplifier in the source driver. Please refer to FIG. 9, which is a schematic diagram of a source driver 90 according to an embodiment of the present invention. As shown in FIG. 9, the source driver 90 includes a sample latch 902, a hold latch 904, a digital-to-analog converter (DAC) 906, an operational amplifier (OP) 908 and a control circuit 910. The sample latch 902, the hold latch 904 and the DAC 906, which are common components of the source driver, may be well known by a person of ordinary skill in the art, and will not be detailed herein. The operational amplifier 908 is served as an output circuit for driving the display panel, and may be implemented with the circuit structure illustrated in FIG. 2A, 2B, 3 or 4.

In an embodiment, the circuit structure of the operational amplifier AMP_B1 is applied in the operational amplifier 908, which may be composed of two output driving circuits D1 and D2. The operations of the output driving circuits D1 and D2 are controlled by the switches SWA, SWB, SWC and SWD, which receive control signals CTRL from the control circuit 910. In other words, the control circuit 910 may output the control signals CTRL to control the switches in the output stage of the operational amplifier 908, to control the operation mode of the output stage. In this embodiment, the control circuit 910 may receive the information of display data DAT from the hold latch 904, which is configured to store the grayscale data to be converted into the driving voltage output to the panel in the current output cycle. More specifically, each channel of the source driver may include one hold latch and one operational amplifier, and the control circuit 910 may control the operation mode of the operational amplifier according to the display data DAT received from the hold latch of the same channel;

hence, the operational amplifier may be set to be in the high-voltage mode, the mid-voltage mode or the low-voltage mode based on the level of the output driving voltage based on the grayscale data.

Please note that the implementation of controlling the operation mode of the operational amplifier and its output stage based on the display data may be performed in any appropriate manner. In another embodiment, the information of display data received by the control circuit 910 may be obtained from the sample latch or any other node on the data path between the source driver and the timing controller.

It should also be noted that the present invention aims at providing an operational amplifier for the source driver having multiple output driving circuits in its output stage. Those skilled in the art may make modifications and alterations accordingly. For example, in the above embodiments, there are two output driving circuits in the output stage and each driving circuit has two driving transistors. In another embodiment, there may be three or more output driving circuits each having a pair of driving transistors in the output stage. The output stage and the operational amplifier may be configured with more possible operation modes based on the voltage domain of these output driving circuits. In addition, the voltage domain of the output driving circuits may be in any appropriate levels, which should not be served as a limitation of the scope of the present invention.

Figure 10:
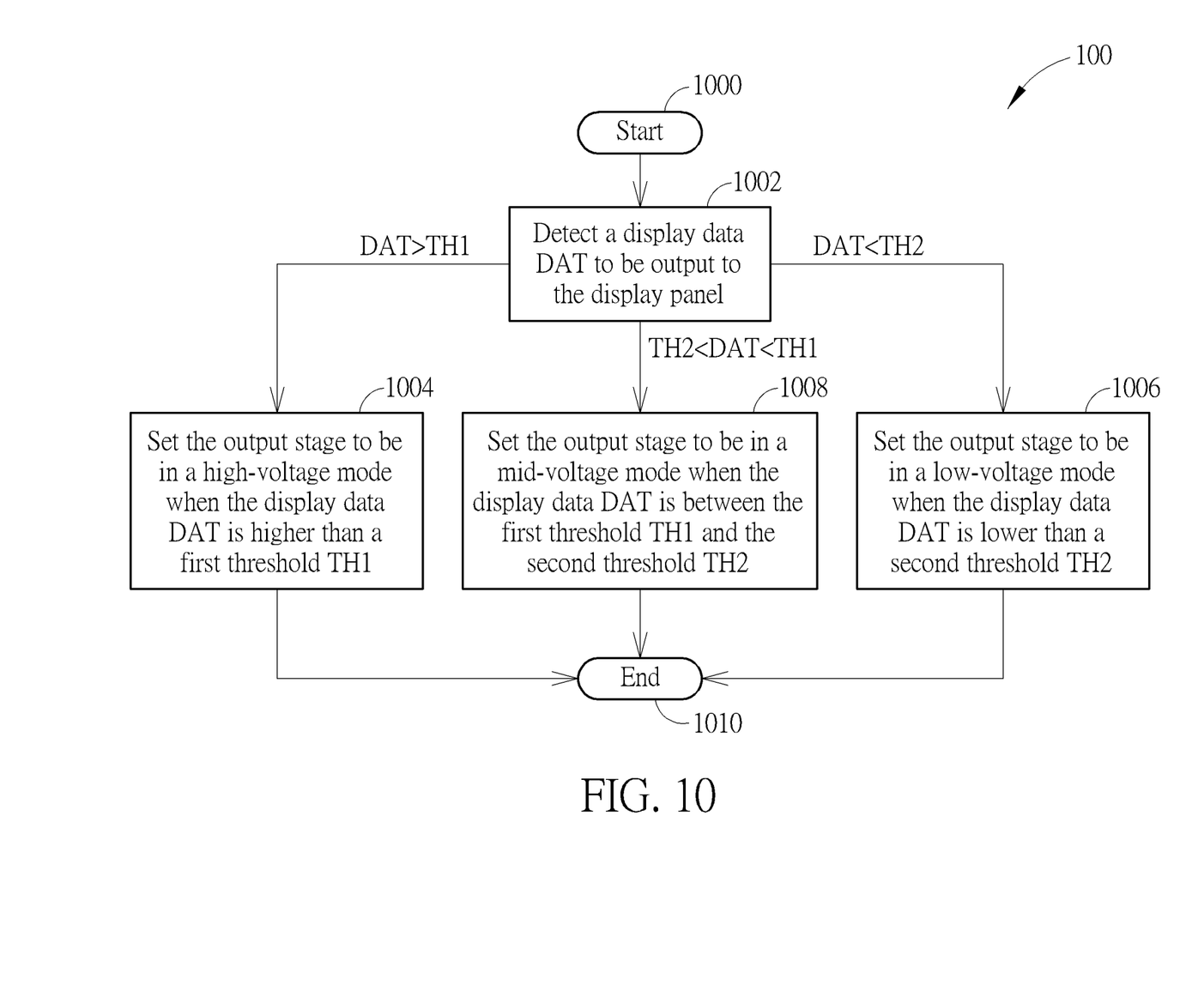
FIG. 10 is a schematic diagram of a process according to an embodiment of the present invention.

The abovementioned implementations and operations of the source driver and the operational amplifier may be summarized into a process 100, as shown in FIG. 10. The process 100 may be implemented in the source driver for driving a display panel such as the source driver 90 as shown in FIG. 9, where the operational amplifier of the source driver has an output stage configured with multiple operation modes. As shown in FIG. 10, the process 100 includes the following steps:

Step 1000: Start.

Step 1002: Detect a display data DAT to be output to the display panel.

Step 1004: Set the output stage to be in a high-voltage mode when the display data DAT is higher than a first threshold TH1.

Step 1006: Set the output stage to be in a low-voltage mode when the display data DAT is lower than a second threshold TH2.

Step 1008: Set the output stage to be in a mid-voltage mode when the display data DAT is between the first threshold TH1 and the second threshold TH2.

Step 1010: End.

The detailed operations of the process 100 are illustrated in the above paragraphs, and will not be repeated herein.

To sum up, the present invention provides an operational amplifier for driving the LED panel and a related control method. The output stage of the operational amplifier may include multiple output driving circuits operated in different voltage domains, allowing the output stage to be operated in different operation modes. If the driving voltage is higher than a first threshold, the output stage may be set to be in the high-voltage mode; if the driving voltage is lower than a second threshold, the output stage may be set to be in the low-voltage mode; if the driving voltage is between the first threshold and the second threshold, the output stage may be set to be in the mid-voltage mode. The implementations of the high-voltage mode and the low-voltage mode allow the reuse of currents between the operational amplifiers in the source driver. The mid-voltage mode may solve the problem of insufficient loop gain of the operational amplifier near the medium voltage, so as to prevent image degradation in moderate brightness. As a result, the overall current consumption of the operational amplifiers in the source driver may be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier for outputting a display data to drive a display panel, comprising:
   an input stage;
   a gain stage, coupled to the input stage; and
   an output stage, coupled to the gain stage, comprising:
      a first output driving circuit, operated in a first voltage domain, the first output driving circuit comprising:
         a first transistor, coupled between a high power supply terminal and an output terminal of the amplifier; and
         a second transistor, coupled between a medium power supply terminal and the output terminal of the amplifier; and
      a second output driving circuit, operated in a second voltage domain different from the first voltage domain, the second output driving circuit comprising:
         a third transistor, coupled between the medium power supply terminal and the output terminal of the amplifier; and
         a fourth transistor, coupled between a low power supply terminal and the output terminal of the amplifier.

2. The amplifier of claim 1, wherein the first output driving circuit is operated by receiving a first power supply voltage and a medium voltage, and the second output driving circuit is operated by receiving a second power supply voltage and the medium voltage.

3. The amplifier of claim 1, further comprising:
   a first switch, coupled to the first transistor;
   a second switch, coupled to the second transistor;
   a third switch, coupled to the third transistor; and
   a fourth switch, coupled to the fourth transistor.

4. The amplifier of claim 3, wherein the first switch and the second switch are turned on and the third switch and the fourth switch are turned off in a high-voltage mode, and the third switch and the fourth switch are turned on and the first switch and the second switch are turned off in a low-voltage mode.

5. The amplifier of claim 3, wherein the first switch and the fourth switch are turned on and the second switch and the third switch are turned off in a mid-voltage mode.

6. A method for controlling an amplifier for outputting a display data to drive a display panel, the amplifier having an output stage configured to be operated in one of a plurality of operation modes, the method comprising:
   detecting the display data to be output to the display panel; and
   setting the output stage to be in one of the plurality of operation modes according to the display data;
   wherein the step of setting the output stage to be in one of the plurality of operation modes according to the display data comprises:
      setting the output stage to be in a high-voltage mode among the plurality of operation modes when the display data is higher than a first threshold;

setting the output stage to be in a low-voltage mode among the plurality of operation modes when the display data is lower than a second threshold; and setting the output stage to be in a mid-voltage mode among the plurality of operation modes when the display data is between the first threshold and the second threshold.

7. The method of claim 6, wherein the step of detecting the display data to be output to the display panel comprises:

detecting the display data by receiving information of the display data from a data latch corresponding to the amplifier in a source driver.

8. The method of claim 6, wherein the step of setting the output stage to be in one of the plurality of operation modes according to the display data comprises:

setting the output stage to be in one of the plurality of operation modes according to at least one most significant bit in a grayscale code of the display data.

* * * * *